US008905319B2

(12) United States Patent
Sun et al.

(10) Patent No.: US 8,905,319 B2
(45) Date of Patent: Dec. 9, 2014

(54) ELECTRONIC COMPONENT AND PRINTED CIRCUIT BOARD WITH RFID TAG

(71) Applicants: Hong Fu Jin Precision Industry (ShenZhen) Co., Ltd., Shenzhen (CN); Hon Hai Precision Industry Co., Ltd., New Taipei (TW)

(72) Inventors: Zong-Yuan Sun, New Taipei (TW); Da-Hua Xiao, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/974,165

(22) Filed: Aug. 23, 2013

(65) Prior Publication Data
US 2014/0183267 A1 Jul. 3, 2014

(30) Foreign Application Priority Data
Dec. 29, 2012 (CN) ...................... 2012 2 0745041 U

(51) Int. Cl.
*G06K 19/06* (2006.01)
*G06K 19/077* (2006.01)
*G05B 19/418* (2006.01)
*H05K 1/02* (2006.01)
*H05K 1/18* (2006.01)

(52) U.S. Cl.
CPC ...... *G06K 19/07758* (2013.01); *G05B 19/4183* (2013.01); *H05K 1/0266* (2013.01); *H05K 1/181* (2013.01); *H05K 2201/10098* (2013.01); *H05K 2201/1053* (2013.01)
USPC .................... 235/492; 235/380; 235/487

(58) Field of Classification Search
CPC ............... G06K 19/0723; G06K 19/07722; G06K 19/0749; G06K 19/07798; G06K 19/0775; G06K 7/0008; G06K 9/00; G06K 19/06; G06K 5/00
USPC ................... 235/492, 380, 487, 451, 375
See application file for complete search history.

(56) References Cited

U.S. PATENT DOCUMENTS

| 2002/0004167 | A1* | 1/2002 | Jenson et al. | 429/162 |
|---|---|---|---|---|
| 2005/0146347 | A1 | 7/2005 | Yevmenenko | |
| 2005/0179549 | A1 | 8/2005 | Ota | |
| 2005/0253726 | A1 | 11/2005 | Yoshida et al. | |
| 2008/0030342 | A1* | 2/2008 | Elizondo et al. | 340/572.7 |
| 2008/0308641 | A1* | 12/2008 | Finn | 235/492 |
| 2010/0264211 | A1* | 10/2010 | Jain et al. | 235/380 |
| 2013/0119143 | A1* | 5/2013 | Fan et al. | 235/492 |
| 2014/0035793 | A1* | 2/2014 | Kato et al. | 343/867 |
| 2014/0203976 | A1* | 7/2014 | Yosui | 343/702 |

FOREIGN PATENT DOCUMENTS

WO WO 2012144482 A1 * 10/2012

* cited by examiner

*Primary Examiner* — Edwyn Labaze
(74) *Attorney, Agent, or Firm* — Novak Druce Connolly Bove + Quigg LLP

(57) ABSTRACT

A printed circuit board (PCB) includes a base board, a number of electronic components and at least one radio frequency identification (RFID) tag. The electronic components are mounted on the base board. The at least one RFID tag is attached to one or more of the electronic components, and is programmed with identification information of the PCB.

13 Claims, 3 Drawing Sheets

ELECTRONIC COMPONENT AND PRINTED CIRCUIT BOARD WITH RFID TAG

BACKGROUND

1. Technical Field

The disclosure generally relates to electronic components, and particularly relates to an electronic component and a printed circuit board with radio frequency identification (RFID) tags.

2. Description of the Related Art

To manage and track printed circuit boards (PCB), the PCBs are labeled with barcodes. However, such labeling requires a clear space on the PCB, making it difficult to further miniaturize the PCBs. Additionally, such labeling may be degraded by high temperatures or be worn away by handling.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present embodiments.

DETAILED DESCRIPTION

Figure 1:
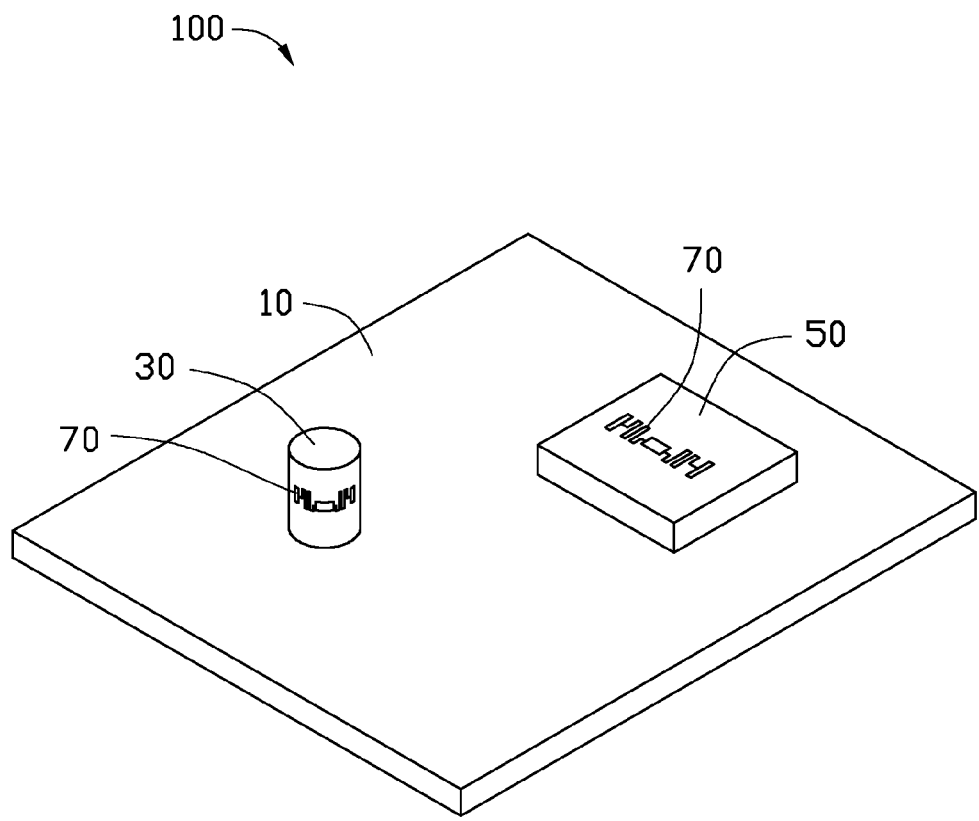
FIG. 1 is an assembled view of a printed circuit board (PCB) with RFID tags, according to an exemplary embodiment.

FIG. 1 is an assembled view of a printed circuit board (PCB) 100 with RFID tags, according to an exemplary embodiment. The PCB 100 includes a base board 10, a plurality of electronic components, and at least one RFID tag 70. In one exemplary embodiment, the plurality of electronic components includes a capacitor 30 and an inductor 50. Both of the capacitor 30 and the inductor 50 are mounted on a side of the base board 10, to receive alternating current (AC) or direct current (DC) from the base board 10.

Figure 2:
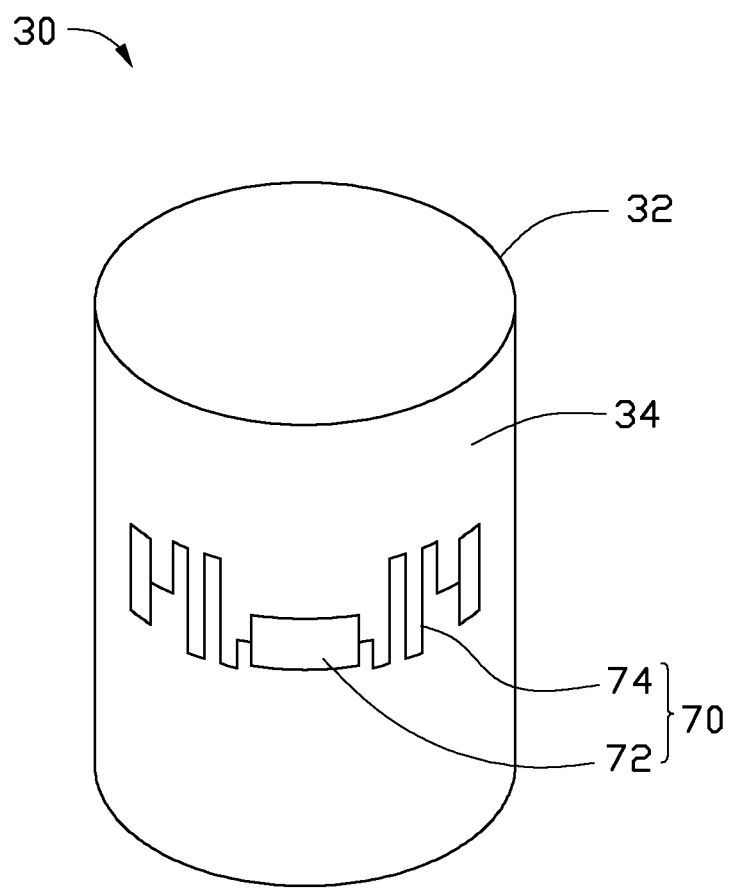
FIG. 2 is a schematic view of a capacitor mounted on the PCB in FIG. 1.

In FIG. 2, the capacitor 30 includes a capsule 32 made of metal or plastic. In one exemplary embodiment, the capsule 32 is a cylinder, and includes a peripheral wall 34.

Figure 3:
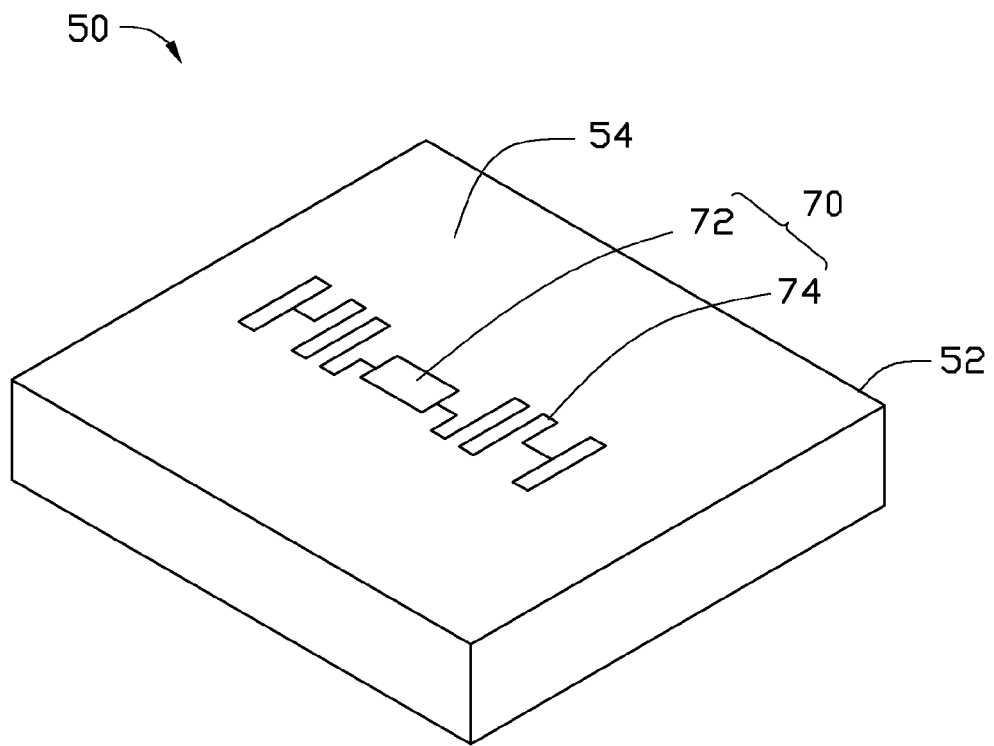
FIG. 3 is a schematic view of an inductor mounted on the PCB in FIG. 1.

In FIG. 3, the inductor 50 includes a shell 52 made of metal or plastic. In one exemplary embodiment, the shell 52 is cube-shaped, and includes a top wall 54.

The RFID tag 70 is a passive electronic component, and works at frequencies of about 125 kHz, 133 kHz, 13.56 MHz, 27.12 MHz, 433 MHz, 902-928 MHz, 2.45 GHz, or 5.8 GHz, for example. The RFID tag 70 is attached to the plurality of electronic components. For example, the RFID tag 70 can be adhered to the peripheral wall 34 of the capacitor 30 via adhesive. For another example, the RFID tag 70 can be bonded on the top wall 54 of the inductor 50 using known processes. Because the RFID 70 is a passive component, it will not electronically interfere with the plurality of electronic components.

The RFID tag 70 includes a microchip 72 and an induction coil 74 electronically connected to the microchip 72. The induction coil 74 inducts a magnetic field generated by the alternating current of the PCB 100, and thus outputs a driving current to turn on the microchip 72. Thus, the microchip 72 does not need other power sources. The microchip 72 stores predetermined identification information of the PCB 100 such as name, production date, type, and other related information. The RFID tag 70 communicates with a RFID reader (not shown) via the induction coil 74, to send the predetermined identification information to the RFID reader. Thus, the PCB 100 can be managed and tracked.

Since the RFID tag 70 is mounted on the plurality of electronic components, a clear space on the base board 10 is not needed. Thus, design and manufacture of the PCB 100 is simplified and reduces costs.

In other exemplary embodiments, the RFID tag 70 can be mounted on other suitable locations of the capacitor 30 and the inductor 50 or other permanently mounted components with suitable surfaces.

In other exemplary embodiments, the plurality of electronic components can further include other elements, such as connectors, for example.

In summary, the RFID tag 70 is mounted on one or more of the plurality of electronic components which are permanently mounted on the base board 10. Thus, this is very convenient for users in managing and tracking the PCB 100.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in the matters of shape, size, and arrangement of parts within the principles of the exemplary disclosure to the full extent indicated by the broad general meaning of the terms in which the appended claims are expressed.

What is claimed is:

1. A printed circuit board (PCB), comprising:
    a base board;
    a plurality of electronic components mounted on the base board; and
    at least one radio frequency identification (RFID) tag mounted on the plurality of electronic components, and the at least one RFID tag storing predetermined identification information of the PCB;
    wherein the least one RFID tag comprises a microchip and an induction coil electronically connected to the microchip, the induction coil inducts a magnetic field generated by the base board, and outputs a driving current to turn on the microchip.

2. The PCB as claimed in claim 1, wherein the plurality of electronic components comprises a capacitor, the at least one RFID tag is mounted on the capacitor.

3. The PCB as claimed in claim 2, wherein the capacitor has a peripheral wall, and the at least one RFID tag is adhered to the peripheral wall via adhesive.

4. The PCB as claimed in claim 1, wherein the plurality of electronic components comprises an inductor, the at least one RFID tag is attached to the inductor.

5. The PCB as claimed in claim 4, wherein the inductor comprises a shell having a top wall, and the at least one RFID tag is bonded on the top wall.

6. The PCB as claimed in claim 1, wherein the least one RFID tag is a passive electronic component.

7. The PCB as claimed in claim 1, wherein the predetermined identification information is stored in the microchip.

8. A printed circuit board (PCB), comprising:
    a base board, the base board integrating a plurality of electronic components, and at least one of the plurality of electronic components provided with at least one radio frequency identification (RFID) tag;

wherein the at least one RFID tag comprises a microchip and an induction coil electronically connected to the microchip, the induction coil inducts a magnetic field generated by the base board, and outputs a driving current to turn on the microchip, the microchip stores predetermined identification information of the PCB.

9. The PCB as claimed in claim 8, wherein the plurality of electronic components comprises a capacitor, the at least one RFID tag is attached to the capacitor.

10. The PCB as claimed in claim 8, wherein the plurality of electronic components comprises an inductor, the at least one RFID tag is mounted on the inductor.

11. An electronic component integrated on a base board, the electronic component comprising:

a radio frequency identification (RFID) tag comprising a microchip and an induction coil electronically connected to the microchip; the microchip and the induction coil both attached to an external wall of the electronic component, the induction coil inducts a magnetic field generated by the base board, and outputs a driving current to turn on the microchip.

12. The electronic component as claimed in claim 11, wherein the electronic component is a capacitor having a peripheral wall, and the RFID tag is adhered to the peripheral wall via adhesive.

13. The electronic component as claimed in claim 11, wherein the electronic component is an inductor having a top wall, and the RFID tag is bonded on the top wall.

\* \* \* \* \*